United States Patent [19]

Hirtz et al.

[11] Patent Number: 5,324,685
[45] Date of Patent: Jun. 28, 1994

[54] METHOD FOR FABRICATING A MULTILAYER EPITAXIAL STRUCTURE

[76] Inventors: Reinhold Hirtz, 6 Greenland Dr., Huntington, N.Y. 11747; Gregory Zakaluk, 2425 Aron Dr., North Seaford, N.Y. 11783; Joseph Chan, 27 Robin La., Kings Park, N.Y. 11754; Dennis Garbis, 29 Darby Dr., Huntington Station, N.Y. 11746; Lawrence Laterza, 5 Rustic Rd., Miller Place, N.Y. 11764; Ali Salih, 118 Gun La., Levittown, N.Y. 11756

[21] Appl. No.: 15,384

[22] Filed: Feb. 9, 1993

[51] Int. Cl.$^5$ .......................................... H01L 21/203
[52] U.S. Cl. ..................................... 437/95; 437/110; 148/33.5
[58] Field of Search ............... 437/95, 97, 108, 110, 437/112, 949, 973; 148/DIG. 7, DIG. 22, DIG. 41, DIG. 154, 33.5

[56] References Cited

U.S. PATENT DOCUMENTS

| | | | |
|---|---|---|---|
| 3,454,434 | 7/1969 | Jackson et al. | 148/33.5 |
| 4,696,701 | 9/1987 | Sullivan | 437/95 |
| 4,859,626 | 8/1989 | Wise | 437/95 |

FOREIGN PATENT DOCUMENTS

| | | | |
|---|---|---|---|
| 0034756 | 3/1979 | Japan | 437/95 |

OTHER PUBLICATIONS

Bauer et al., Fundamental Issues in Heteroepitaxy. A Department of Energy Council on Materials Sources, Journal of Materials Research, vol. 5, #4, Apr. 1990, pp. 852-895.

Wijaranakula et al., Journal of Materials Research, vol. 1, #5, Sep./Oct. 1986, Oxygen Precipitation in Epitaxial Silicon Wafers, pp. 693-697.

Galewski et al., IEEE Transaction of Semiconductor Manufacturing, Aug. 1990, vol. 3, #3, pp. 93-97, Silicon Wafer Preparation for Low Temperature Selective Epitaxial Growth.

*Primary Examiner*—Tom Thomas
*Assistant Examiner*—Chandra Chaudhari
*Attorney, Agent, or Firm*—James & Franklin

[57] ABSTRACT

An all epitaxial process performed entirely in a CVD reactor is employed to grow heavily doped layer on lightly doped layer on a heavily doped substrate, eliminating the need for separate diffusion, even for high impurity concentrations. The process starts with a heavily doped silicon substrate of carrier concentration typically greater than $1 \times 10^{19}$ per cm$^3$. To minimize outdiffusion, the substrate is "capped" by growing very thin and heavily doped silicon layers which are depleted by hydrogen purges. A first epitaxial layer is grown over the "capped" substrate. This layer is relatively lightly doped, having a resistivity of more than 200 ohm.cm. A second epitaxial layer is then grown over the first epitaxial layer. The second epitaxial layer has a polarity opposite to that of the substrate and is heavily doped to a resistivity of less than 0.005 ohm cm.

9 Claims, 1 Drawing Sheet

METHOD FOR FABRICATING A MULTILAYER EPITAXIAL STRUCTURE

BACKGROUND OF THE INVENTION

The present invention relates to semiconductor wafers and more particularly to a unique multilayer epitaxial structure having heavily doped layers and to a method for fabricating same by epitaxial techniques in a single continuous operation in the chamber of a chemical vapor deposition reactor.

Semiconductors of many types are formed on wafers which are commonly made of silicon crystal material. The material is produced by an epitaxial grown process in accordance with well known chemical vapor deposition principles. The growth of the material takes place in vessels called chemical vapor deposition (CVD) reactors specially designed for this purpose. Such reactors have facility to control growth conditions such as temperature and pressure, as well as impurity concentrations.

Certain types of semiconductors such as power diodes and Zener diodes have specific electrical parameter requirements, for example, forward voltage drop, leakage current and breakdown voltages, which are difficult to accurately control by conventional diffusion means. A multilayer epitaxial structure as proposed in this disclosure will provide accurate controls to meet the device electrical parameters requirements. In addition, the said proposal will eliminate the need for impurity diffusion.

The said multilayer structure is epitaxially grown with a top layer having high impurity concentration and middle layer having light impurity concentration deposited on a substrate of high impurity concentration with opposite or same dopant type.

However, the formation of heavily doped layers by epitaxial growth usually means slow growth rates and the presence of high impurity concentrations in the material leads to problems with "outdiffusion", where the high dopant concentration layers tend to contaminate low concentration layers, as the material containing the heavily doped layer is heated to high temperature for processing. Another problem associated with heavily doped epitaxially grown layer is "autodoping" in which dopant moves into the gas stream. This autodopant together with highly concentrated dopant gas used, contaminates epi reactor chamber and quartz ware and therefore tends to degrade resistivity control on subsequent runs (the so called "memory effect"). Consequently, where high impurity concentrations are required, it has been necessary to form the doped layer by diffusion in a separate vessel called a diffusion tube.

SUMMARY OF THE INVENTION

The present invention is a multilayer epitaxial structure with heavily doped layers and lightly doped layer and a method for fabricating same without diffusion which overcomes the problems normally associated with use of materials with high impurity concentrations in a CVD reactor. Our process permits epitaxial technology to replace diffusion entirely. Accordingly, it permits the structure to be formed by a single continuous epitaxial process in a single apparatus. Moreover, the method produces a superior quality product, improved device performance and higher device yields.

In general, the structure starts with a heavily doped substrate of a silicon material, preferably with a resistivity of less than 0.0035 ohm cm. Very thin "cap" layers are formed in succession on the substrate, rapidly followed by hydrogen purges which deplete the dopant concentration in the reactor chamber. A first epitaxial layer which is relatively lightly doped and has a relatively high resistivity (0.1 to 200 ohm cm.) is grown over the "capped" substrate to a thickness of less than 100 microns. A relatively heavily doped second epitaxial layer is then grown over the first epitaxial layer. The second epitaxial layer preferably has a carrier concentration greater than $1 \times 10^{19}$ per $cm^3$ and hence a very relatively low resistivity. It has a polarity opposite to that of the substrate.

It is, therefore, a prime object of the present invention to provide a multilayer epitaxial structure and method for fabricating same which overcomes the problems associated with dopant memory effect and autodopant effect in a chemical vapor deposition reactor, permitting formation of a multilayer structure by an all epitaxial process.

It is another object of the present invention to provide a multilayer epitaxial structure and method for fabricating same which includes a substrate capped with doped layers to minimize outdiffusion to the subsequently grown epitaxial layer.

It is another object of the present invention to provide a method for growing an all epitaxial multilayer structure which can take place in a single continuous operation in a single vessel.

It is another object of the present invention to provide a chemical vapor deposition process in which heavily doped regions can be accommodated without contamination of the vessel.

In accordance with one aspect of the present invention, a multilayer epitaxial structure is provided comprising heavily doped substrate of a given polarity. A doped layer is formed to cap the substrate. A lightly doped epitaxial layer is grown above the "capped" substrate. A heavily doped epitaxial layer of polarity opposite to the substrate is grown above the lightly doped epitaxial layer.

The substrate preferably has a resistivity of less than 0.0035 ohm cm. The lightly doped epitaxial layer preferably has a resistivity in the range of 0.1 to 200 ohm cm. and a thickness of less than 100 microns.

The lightly doped epitaxial layer may have the same polarity as to the substrate or the opposite polarity. The heavily doped epitaxial layer preferably has a thickness less than 100 microns.

The carrier concentration of the substrate is preferably greater than $1 \times 10^{19}$ per $cm^3$. The carrier concentration of the heavily doped epitaxial layer is also preferably greater than $1 \times 10^{19}$ per $cm^3$.

In accordance with another aspect of the present invention, a multilayer epitaxial structure is provided comprising a substrate having a resistivity of less than 0.002 ohm cm. First and second successive doped layers are formed over the substrate. A first epitaxial layer, situated above the doped layers, is grown having a resistivity in the range of less than 50 ohm cm. and a thickness of less than 100 microns. A second epitaxial layer, situated above said first epitaxial layer, is grown having a resistivity of less than 0.005 ohm cm. and thickness of less than 100 microns. The substrate and the second epitaxial layer are of opposite polarity.

The substrate preferably has a resistivity in the range of 0.001 to 0.002 ohm cm. The first epitaxial layer preferably has a resistivity of less than 50 ohm cm. The first epitaxial layer preferably has a thickness in the range of 5–100 microns. The first epitaxial layer preferably has a resistivity of less than 0.002 ohm cm.

In accordance with another aspect of the present invention, an all epitaxial method for fabricating a multilayer structure is provided. A substrate of a given polarity composed of heavily doped material is formed. A doped "cap" layer is grown over the substrate. A first epitaxial layer of lightly doped material is then grown above the capped substrate. A second epitaxial layer of heavily doped material is grown above the first epitaxial layer. The second epitaxial layer has a polarity opposite to that of the substrate.

The step of forming the cap layer comprises heating the substrate, introducing silicon gas with or without dopant gas to grow a thin layer and purging the layer with hydrogen to deplete the dopant from the layer. Preferably, to separate "cap" layers are formed in succession in this manner.

The step of forming the substrate preferably comprises forming the substrate of a material with a resistivity of less than 0.0035 ohm cm; preferably in the range of 0.001 to 0.002 ohm cm. The silicon is doped to a concentration of greater than $1 \times 10^{19}$ per cm$^3$. Preferably the silicon is introduced into the chamber through the use of gases selected is from a group of compounds consisting of trichlorosilane, chlorosilane or silane.

The step of growing the first epitaxial layer preferably comprises the step of epitaxially growing the first epitaxial layer in a chemical vapor deposition reactor in a hydrogen ambient at a temperature between 1000.C and 1200.C. The layer is formed with a resistivity of less than 200 ohm cm, preferably a resistivity of less than 50 ohm cm and a thickness of 5 to 100 microns.

The step of growing the second epitaxial layer comprises the step of epitaxially growing the second epitaxial layer in a chemical vapor deposition reactor in a gas environment which is the source of a dopant selected from the group of arsenic, phosphorus and antimony. The step of growing the second epitaxial layer comprises the step of epitaxially growing the layer with a resistivity of less than 0.005 ohm cm. and a thickness of less than 100 microns. Preferably, the layer is doped to a concentration of greater than $1 \times 10^{19}$ per cm$^3$.

To these and such other objects which may herein after appear, the present invention relates to a multilayer epitaxial structure and method for fabricating same as described in the following specifications and recited in the annexed claims, taken together with the accompanying drawings, wherein like numerals refer to like parts.

DESCRIPTION OF THE PREFERRED EMBODIMENTS

Figure 1:
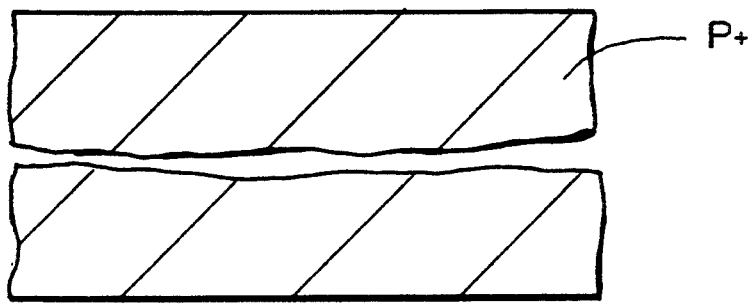
FIG. 1 is an idealized cross-sectional view of the substrate.
Figure 2:
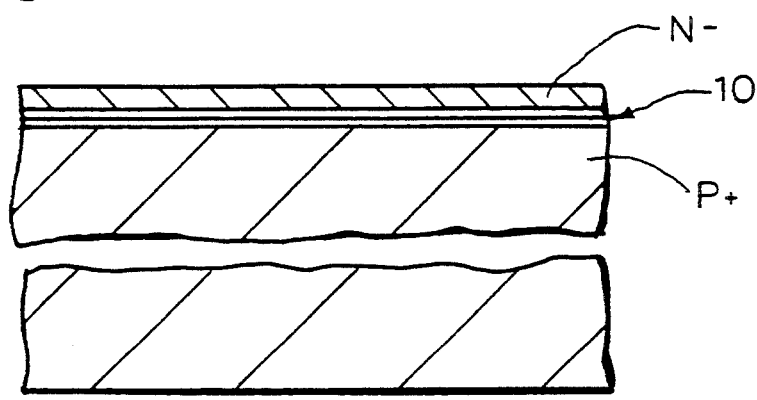
FIG. 2 is a view similar to FIG. 1 showing the first epitaxial layer on the "capped" substrate; an FIG. 3 is a view similar to FIG. 2 showing the second epitaxial layer.
Figure 3:
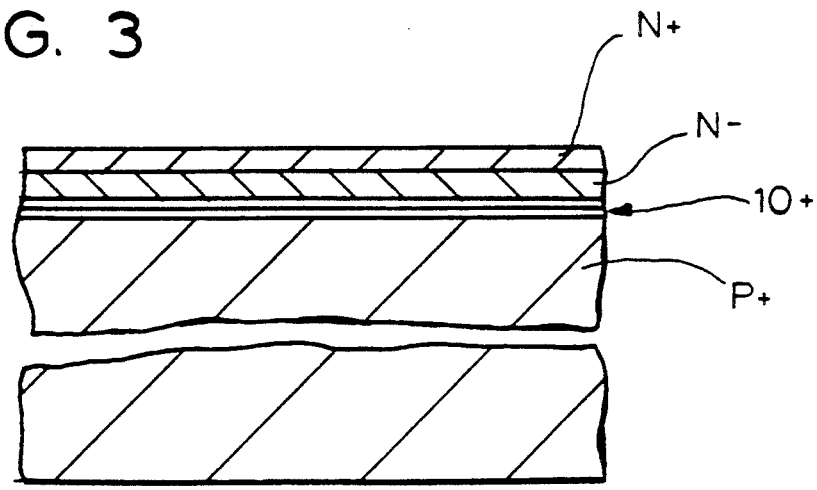

Certain modifications to the gas feed and venting system for the CVD reactor, as described in detail in commonly owned copending application Ser. No. 08/015,658 file GI-SEMI-242 in the names of Joseph Chan, Dennis Garbis, John Sapio, and John Latza, and entitled GAS FLOW SYSTEM FOR CVD REACTOR, make the process more suitable for use in large scale production. This application discloses a gas flow system which reduces residue dopants which would otherwise remain in the reactor or associated plumbing and may adversely affect subsequent runs by degrading resistivity control. The reader is referred to that application for further information in that regard.

The invention is described herein in the context of the processing of material for the fabrication of power diodes. It is particularly useful in this application because this process eliminates the necessity for front an back diffusions normally required when fabricating such devices. However, the invention should not be construde as being limited to this specific application. Other uses of the invention in the fabrication devices of many other configurations will be obvious to those skilled in the art.

The process begins with a heavily doped P-type substrate, preferably with an impurity concentration typically greater than $1 \times 10^{19}$ per cm$^3$ and a resistivity of less than 0.0035 ohm cm, typically in the 0.001 to 0.002 ohm cm range. It may have a thickness of 14 to 16 mils. Conventionally, such a substrate, after being grown in a CVD reactor, would be transferred to a separate vessel, known as a diffusion tube, for formation of the doped regions using well known diffusion techniques. However, with the present invention, the multilayer structure, including heavily doped layers can be made in the CVD chamber itself, in a single continuous epitaxial process.

The susceptor in the CVD chamber is preferably silicon coated. This minimizes autodoping from the backside of the substrate. Silicon capping techniques are used to minimize outdiffusion from the substrate.

After heating the substrate in the CVD chamber and cleaning the surface with HCl, the substrate surface is "capped". Capping is accomplished by growing a cap layer 10 of very thin silicon sublayers on the substrate and depleting the dopant level of each sublayer after it is formed.

The substrate is heated to a temperature over 1000° C. in an H$_2$ atmosphere containing a silicon source gas to form each sublayer. The growth rate is relatively fast, approximately 2.5 microns per minute, to minimize cycle time. After each thin sub layer is formed, it is subjected to a hydrogen purge which depletes the dopant level dramatically. The cycle is then preferably repeated so that the cap layer 10 is formed of at least two sublayers of depleted silicon. At present, two cap sublayers are preferred, although more may be employed, if desirable.

The silicon source for the cap layer 10 is preferably trichlorosilane. It is introduced in the reactor in a hydrogen ambient of one atmospheric pressure and at a temperature between 1000° and 1200° C. However, other sources of silicon, such as chlorosilane or silane, can be used with appropriate temperature and growth rates.

The first layer is then epitaxially grown over the capped substrate surface in the CVD reactor. This is a relatively lightly doped, high ohmic region and can be of either polarity. In the example, the layer maybe N-type. An appropriate source gas provides the necessary impurities. This layer has a resistivity in the range of 0.1 to 200 ohm cm; preferably less than 50 ohm cm. It has a thickness of between 0.1 and 100 microns, preferably between 5 and 100 microns.

A second layer is then epitaxially grown on the first epitaxial layer in the CVD reactor. This layer will be of a low ohmic region, and is relatively heavily doped, like the substrate. It is, however, of opposite polarity to the substrate, in this case, N+. Phosphine may be use as a source of phosphorus ions. Alternatively, arsenic or antimony ions can be employed. An impurity concentration of greater than $1 \times 10^{19}$ per $cm^3$ is preferred, with a resistivity similar to that of the substrate.

Throughout the process, the growth temperatures are 1000° and 1200° C. and pressure in the reactor is kept at 1 atmospheric in a hydrogen ambient. Silicon capping techniques are employed to minimize outdiffusion from the substrate. Silicon-coated susceptors are employed in the CVD reactor to minimize autodoping from the backside of the substrates. Hydrogen purges are employed to deplete the remaining capping sublayers after growth. Fast growth rates of approximately 2.5 microns per minute minimize cycle time.

This process permits the entire structure to be achieved in a single continuous production run in a single apparatus. Moreover, the process eliminates the need for front and back diffusions normally required for power semiconductor devices.

This structure and method improves the forward voltage drop, leakage current and breakdown voltage distribution characteristics of the semiconductor devices. The heavily doped layers improve ohmic contact during metallization and packaging. It also reduces processing steps by simplifying the process to be all expitaxial and at the same time improves fabrication yields.

It should now be appreciated that the present invention relates to a multilayer epitaxial structure and an all epitaxial method for fabricating same. The structure includes a heavily doped, low resistivity substrate of one polarity, a high resistivity, middle layer grown on the capped substrate and a heavily doped, low resistivity top layer of opposite polarity to the substrate grown on the middle layer. The interfaces between one low ohmic region (substrate or top layer) and the high ohmic region (middle layer) form the electronic junctions.

While only a single embodiment of the present invention has been disclosed for purposes of illustration, it is obvious that many variations and modifications could be made thereto. It is intended to cover all of these variations and modifications which fall within the scope of the present invention as defined by the following claims:

We claim:

1. An all epitaxial method for fabricating a multilayer structure for a semiconductor in CVD reactor chamber comprising:
    a) forming a substrate of a polarity of heavily doped silicon;
    b) growing a first silicon cap layer over the substrate;
    c) purging the chamber after the first cap layer is grown;
    d) growing a second silicon cap layer;
    e) purging the chamber after the second silicon cap layer is grown;
    f) growing a lightly doped first epitaxial layer above the second capped layer; and
    g) growing a heavily doped second epitaxial layer above the first epitaxial layer, the second epitaxial layer having a polarity opposite to the polarity of the substrate.

2. The method of claim 1 wherein the step of forming the substrate comprises forming a substrate of a material with a resistivity of less than 0.0035 ohm cm.

3. The method of claim 1 wherein the step of forming the substrate comprises forming the substrate of a material with a resistivity in the range of 0.001 to 0.002 ohm cm.

4. The method of claim 1 wherein the step of forming the cap layer comprises the step of heating the substrate in an atmosphere containing a source of silicon obtained from a group of compounds consisting of trichlorosilane, chlorosilane and silicone.

5. The method of claim 1 wherein the step of growing the first epitaxial layer comprises the step of growing the first epitaxial layer in a chemical vapor deposition reactor in a hydrogen ambient at a temperature between 1000° C. and 1200° C.

6. The method of claim 1 wherein the step of growing the first epitaxial layer comprises the step of growing a layer in a chemical deposition reactor with a resistivity of less than 200 ohm cm.

7. The method of claim 1 wherein the step of growing the first epitaxial layer comprises the step of growing the layer in a chemical deposition reactor with a resistivity of less than 50 ohm cm.

8. The method of claim 1 wherein the step of growing the first epitaxial layer comprises the step of growing a layer in a chemical deposition reactor with a thickness of 5 to 100 microns.

9. The method of claim 1 wherein the step of growing the second epitaxial layer comprises the step of growing the second epitaxial layer on the first epitaxial layer in a chemical vapor deposition reactor in a gas environment which is the source of dopant selected from the group of arsenic, phosphorus and antimony.

* * * * *